US011323081B2

(12) United States Patent
Arayashiki et al.

(10) Patent No.: US 11,323,081 B2
(45) Date of Patent: *May 3, 2022

(54) POWER AMPLIFIER CIRCUIT

(71) Applicant: Murata Manufacturing Co., Ltd., Kyoto (JP)

(72) Inventors: Satoshi Arayashiki, Kyoto (JP); Kazuo Watanabe, Kyoto (JP); Satoshi Tanaka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/078,876

(22) Filed: Oct. 23, 2020

(65) Prior Publication Data

US 2021/0044262 A1 Feb. 11, 2021

Related U.S. Application Data

(63) Continuation of application No. 16/417,723, filed on May 21, 2019, now Pat. No. 10,848,111.

(30) Foreign Application Priority Data

Jul. 5, 2018 (JP) .............................. JP2018-128529

(51) Int. Cl.
*H03F 3/45* (2006.01)
*H03F 3/21* (2006.01)
(Continued)

(52) U.S. Cl.
CPC ............ *H03F 3/211* (2013.01); *H03F 1/0211* (2013.01); *H03F 3/45089* (2013.01);
(Continued)

(58) Field of Classification Search
CPC .... H03F 3/211; H03F 3/45089; H03F 1/0211; H03F 3/45085; H03F 3/45183;
(Continued)

(56) References Cited

U.S. PATENT DOCUMENTS 7,529,529 B2   5/2009   Taylor
8,704,597 B2   4/2014   Yu et al.
(Continued)

FOREIGN PATENT DOCUMENTS

JP   2015-115835 A   6/2015
WO   2013/129431 A1   9/2013

OTHER PUBLICATIONS

Tanaka, "Evolution of Power Amplifier for Mobile Applications" International Meeting for Future of Electron Devices, 2013, p. 112-113, IEEE.

*Primary Examiner* — Khanh V Nguyen
(74) *Attorney, Agent, or Firm* — Pearne & Gordon LLP

(57) ABSTRACT

A power amplifier circuit includes lower-stage and upper-stage differential amplifying pairs, a combiner, first and second inductors, and first and second capacitors. First and second signals are input into the lower-stage differential amplifying pair. The upper-stage differential amplifying pair outputs first and second amplified signals. The combiner combines the first and second amplified signals. The lower-stage differential amplifying pair includes first and second transistors. A supply voltage is supplied to the collectors of the first and second transistors. The first and second signals are supplied to the bases of the first and second transistors. The upper-stage differential amplifying pair includes third and fourth transistors. A supply voltage is supplied to the collectors of the third and fourth transistors. The emitters of the third and fourth transistors are grounded via the first and
(Continued)

second inductors and are connected to the first and second transistors via the first and second capacitors.

20 Claims, 11 Drawing Sheets

(51) Int. Cl.
*H03F 1/02* (2006.01)
*H03F 3/30* (2006.01)

(52) U.S. Cl.
CPC ........ *H03F 3/3022* (2013.01); *H03F 3/45085* (2013.01); *H03F 3/45183* (2013.01); *H03F 2200/102* (2013.01); *H03F 2200/21* (2013.01); *H03F 2200/267* (2013.01); *H03F 2200/451* (2013.01); *H03F 2203/21106* (2013.01); *H03F 2203/21142* (2013.01); *H03F 2203/45138* (2013.01); *H03F 2203/45296* (2013.01); *H03F 2203/45316* (2013.01)

(58) Field of Classification Search
CPC ......... H03F 3/3022; H03F 2203/21142; H03F 2200/267; H03F 2203/45138; H03F 2200/451; H03F 2200/21; H03F 2200/102; H03F 2203/45296; H03F 2203/45316; H03F 2203/21106; H03F 1/302; H03F 3/245; H03F 2200/555; H03F 3/45179; H03F 3/45192; H03F 3/45071; H03F 1/3211; H03L 7/0898; G05F 1/56; G05F 3/262
USPC ................................ 330/253, 261, 310, 311
See application file for complete search history.

(56) References Cited

U.S. PATENT DOCUMENTS

| | | |
|---|---|---|
| 9,621,118 B2 | 4/2017 | Ripley et al. |
| 10,447,206 B2 | 10/2019 | Lee et al. |
| 2007/0146078 A1* | 6/2007 | Bromberger ........ H03F 3/45089 330/302 |
| 2015/0171796 A1 | 6/2015 | Matsui |
| 2016/0056769 A1 | 2/2016 | Takenaka et al. |
| 2018/0152143 A1 | 5/2018 | Tanaka et al. |

* cited by examiner

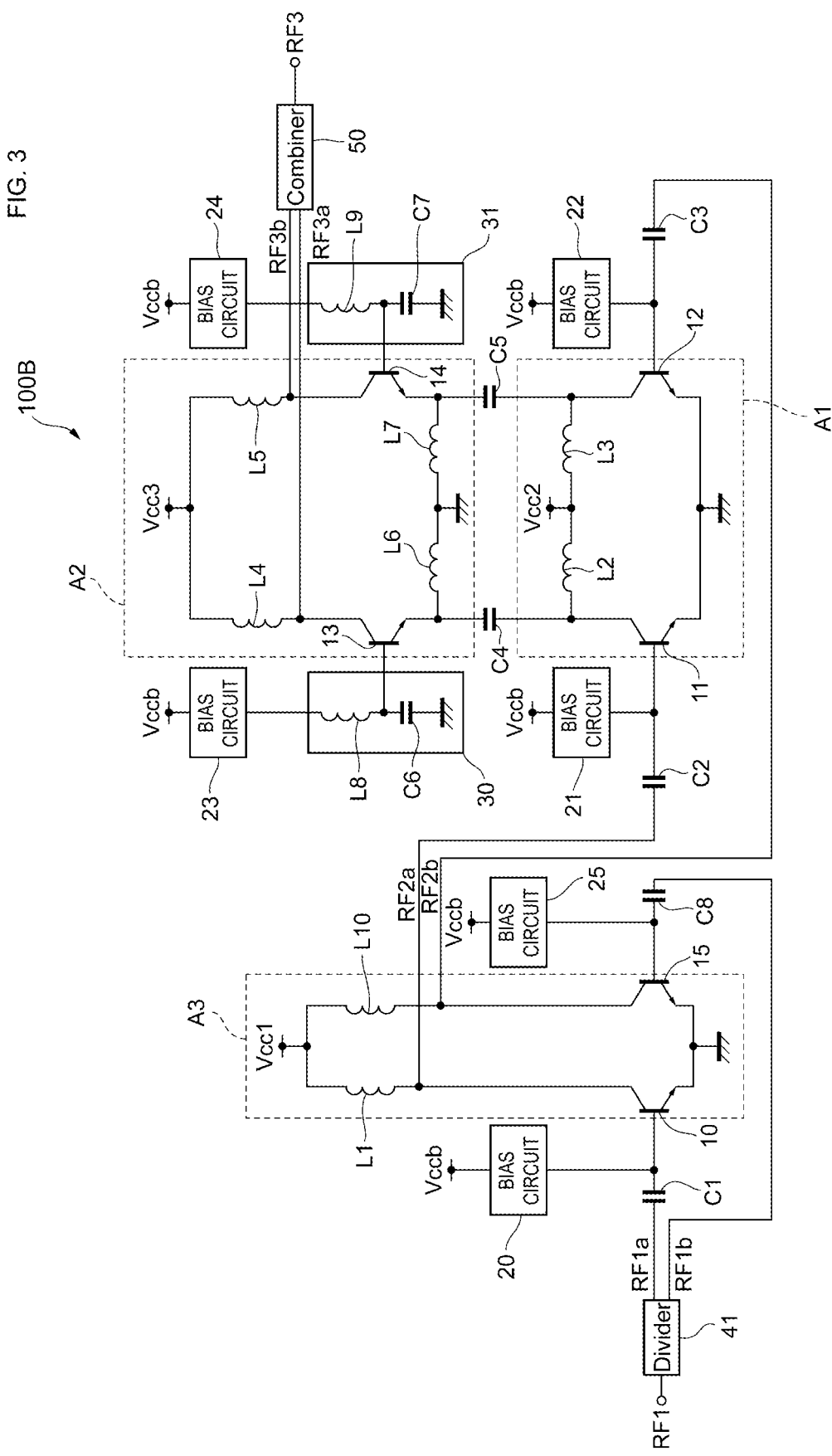

POWER AMPLIFIER CIRCUIT

CROSS REFERENCE TO RELATED APPLICATIONS

This is a continuation of U.S. patent application Ser. No. 16/417,723 filed on May 21, 2019, which claims priority from Japanese Patent Application No. 2018-128529 filed on Jul. 5, 2018. The contents of these applications are incorporated herein by reference in their entireties.

BACKGROUND

The present disclosure relates to a power amplifier circuit. In a mobile communication device, such as a cellular phone, a power amplifier circuit using a transistor is disposed. "Evolution of Power Amplifier for mobile applications" by Satoshi Tanaka, International Meeting for Future of Electron Devices, Kansai (IMFEDK), IEEE, 2013, pp 112-113 discloses a power amplifier circuit using a heterojunction bipolar transistor (HBT). Japanese Unexamined Patent Application Publication No. 2015-115835 discloses a power amplifier circuit including two cascode-connected HBTs.

BRIEF SUMMARY

In a power amplifier circuit, boosting of a power supply voltage can increase the maximum output power. However, in the power amplifier circuit disclosed in the above-described document "Evolution of Power Amplifier for mobile applications", the maximum power supply voltage is restricted due to the collector-base withstand voltage of the transistor. In the power amplifier circuit disclosed in the above-described publication, by cascode-connecting two transistors, the divided voltage is applied to each transistor, and thus, the maximum power supply voltage can be increased to be higher than that in the power amplifier circuit in the above-described document. However, to apply a power supply voltage higher than the maximum battery voltage, a booster conversion circuit is required, which increases the scale of the power amplifier circuit.

The present disclosure has been made in view of the above-described background. The present disclosure provides a power amplifier circuit which is capable of increasing the maximum output power without necessarily substantially increasing the scale of the power amplifier circuit.

According to an embodiment of the present disclosure, there is provided a power amplifier circuit including a lower-stage differential amplifying pair, an upper-stage differential amplifying pair, a combiner, first and second inductors, and first and second capacitors. First and second signals are input into the lower-stage differential amplifying pair. The upper-stage differential amplifying pair is disposed at an upper stage of the lower-stage differential amplifying pair and outputs first and second amplified signals corresponding to the first and second signals, respectively. The combiner combines the first and second amplified signals and outputs a composite signal. The lower-stage differential amplifying pair includes first and second transistors. A first power supply voltage is supplied to a collector or a drain of the first transistor. An emitter or a source of the first transistor is grounded. The first signal is supplied to a base or a gate of the first transistor. The first power supply voltage is supplied to a collector or a drain of the second transistor. An emitter or a source of the second transistor is grounded. The second signal is supplied to a base or a gate of the second transistor. The upper-stage differential amplifying pair includes third and fourth transistors. A second power supply voltage is supplied to a collector or a drain of the third transistor. An emitter or a source of the third transistor is grounded via the first inductor and is also connected to the collector or the drain of the first transistor via the first capacitor. The second power supply voltage is supplied to a collector or a drain of the fourth transistor. An emitter or a source of the fourth transistor is grounded via the second inductor and is also connected to the collector or the drain of the second transistor via the second capacitor.

According to an embodiment of the present disclosure, it is possible to provide a power amplifier circuit which is capable of increasing the maximum output power without necessarily substantially increasing the scale of the power amplifier circuit.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 3 illustrates an example of the configuration of a power amplifier circuit according to a second embodiment of the disclosure;

DETAILED DESCRIPTION

Figure 1:
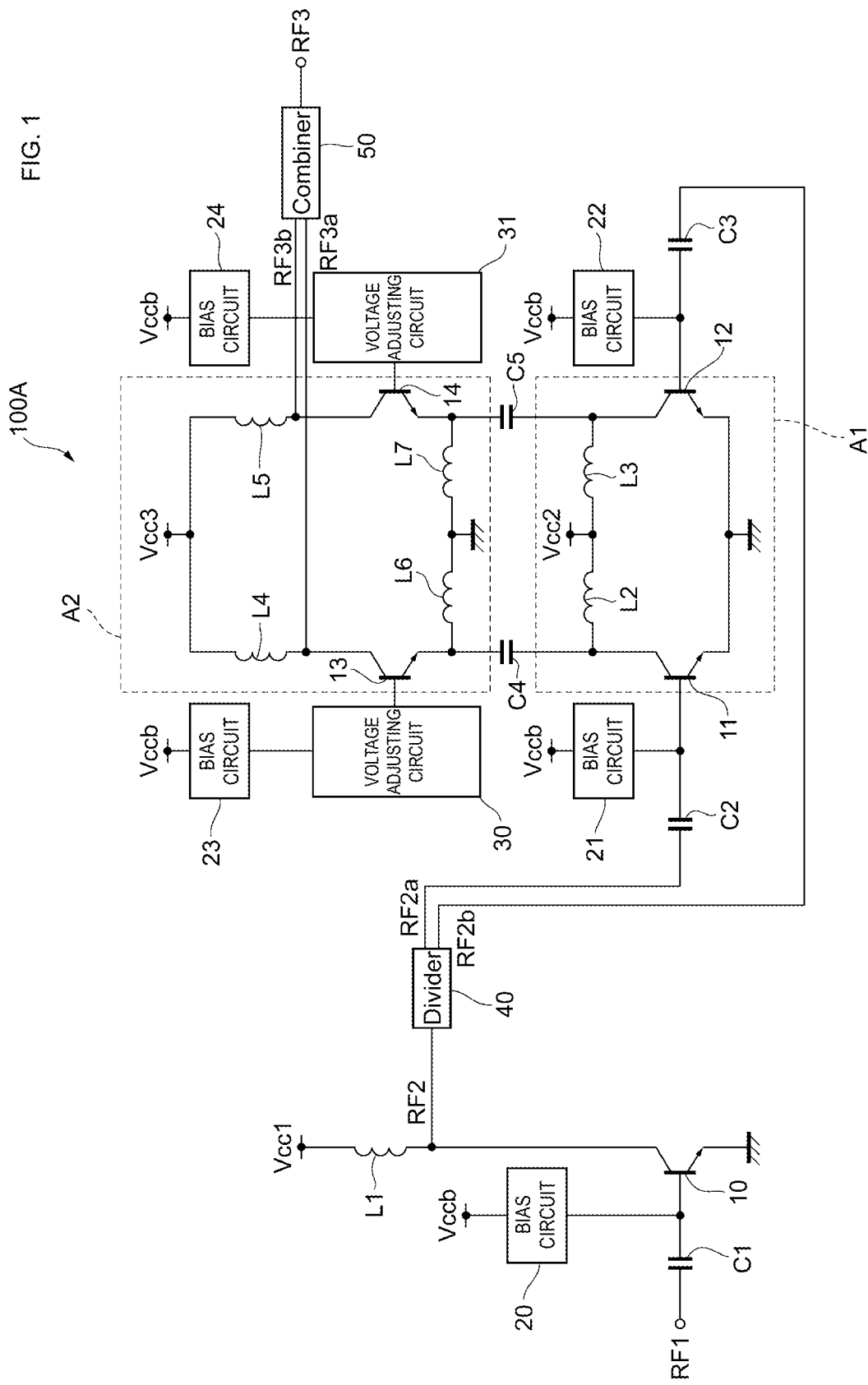
FIG. 1 illustrates an example of the configuration of a power amplifier circuit according to a first embodiment of the disclosure.

Embodiments of the present disclosure will be described below in detail with reference to the accompanying drawings. The same element is designated by like reference numeral, and an explanation thereof will be given only once and will not be repeated.

FIG. 1 illustrates an example of the configuration of a power amplifier circuit 100A according to a first embodiment of the disclosure. The power amplifier circuit 100A is disposed in a mobile communication device, such as a cellular phone, and amplifies an input radio frequency (RF) signal and outputs an amplified signal. The frequency of an RF signal is about several to several dozens of gigahertz, for example.

As shown in FIG. 1, the power amplifier circuit 100A includes transistors 10 through 14, bias circuits 20 through 24, voltage adjusting circuits 30 and 31, a divider 40, a combiner 50, capacitors C1 through C5, and inductors L1 through L7.

The power amplifier circuit 100A includes two-stage amplifiers. The first-stage amplifier (drive-stage amplifier) includes the transistor 10, while the second-stage amplifier (power-stage amplifier) includes the transistors 11 through 14. The drive-stage amplifier amplifies an input signal RF1 and outputs an amplified signal RF2. The power-stage amplifier amplifies the amplified signal RF2 output from the drive-stage amplifier and outputs amplified signals RF3a and RF3b.

In the first embodiment, the transistors 10 through 14 are bipolar transistors, such as HBTs. The transistors 10 through 14 may alternatively be field-effect transistors (FETs), such as metal-oxide-semiconductor field-effect transistors (MOS-FETs), instead of bipolar transistors. In this case, the collector, base, and emitter of a bipolar transistor may be read as the drain, gate, and source of an FET.

A power supply voltage Vcc1 is supplied to the collector of the transistor 10 via the inductor L1. The RF signal RF1 is supplied to the base of the transistor 10 via the capacitor C1. The emitter of the transistor 10 is grounded. A bias current is also supplied to the base of the transistor 10 from the bias circuit 20. With this configuration, the amplified signal RF2 is output from the collector of the transistor 10.

The divider 40 is disposed between the drive-stage amplifier and the power-stage amplifier. The divider 40 divides the amplified signal RF2 output from the collector of the transistor 10 into an amplified signal RF2a (first signal) and an amplified signal (second signal) RF2b that have opposite phases.

The transistor 11 (first transistor) and the transistor 12 (second transistor) form a lower-stage differential amplifying pair A1 which performs a differential amplifying operation. The transistors 11 and 12 will be explained below more specifically. A power supply voltage Vcc2 (first power supply voltage) is supplied to the collector of the transistor 11 via the inductor L2 (third inductor). The amplified signal RF2a is supplied to the base of the transistor 11 via the capacitor C2. The emitter of the transistor 11 is grounded. The power supply voltage Vcc2 is supplied to the collector of the transistor 12 via the inductor L3 (fourth inductor). The amplified signal RF2b is supplied to the base of the transistor 12 via the capacitor C3. The emitter of the transistor 12 is grounded. A bias current or a bias voltage from the bias circuit 21 is supplied to the base of the transistor 11, while a bias current or a bias voltage from the bias circuit 22 is supplied to the base of the transistor 12. With this configuration, amplified signals are output from the collectors of the transistors 11 and 12.

The transistor 13 (third transistor) and the transistor 14 (fourth transistor) form an upper-stage differential amplifying pair A2 which performs a differential amplifying operation in synchronization with the lower-stage differential amplifying pair A1. The transistors 13 and 14 will be explained below more specifically. A power supply voltage Vcc3 (second power supply voltage) is supplied to the collector of the transistor 13 via the inductor L4. A bias current or a bias voltage is supplied from the bias circuit 23 to the base of the transistor 13 via the voltage adjusting circuit 30. The emitter of the transistor 13 is grounded via the inductor L6 (first inductor). The power supply voltage Vcc3 is supplied to the collector of the transistor 14 via the inductor L5. A bias current or a bias voltage is supplied from the bias circuit 24 to the base of the transistor 14 via the voltage adjusting circuit 31. The emitter of the transistor 14 is grounded via the inductor L7 (second inductor). The transistor 13 is cascode-connected to the transistor 11 of the lower-stage differential amplifying pair A1. The emitter of the transistor 13 is connected to the collector of the transistor 11 via the capacitor C4 (first capacitor). The transistor 14 is cascode-connected to the transistor 12 of the lower-stage differential amplifying pair A1. The emitter of the transistor 14 is connected to the collector of the transistor 12 via the capacitor C5 (second capacitor). With this configuration, an amplified signal RF3a (first amplified signal) generated by amplifying the signal output from the lower-stage transistor 11 is output from the collector of the upper-stage transistor 13, and an amplified signal RF3b (second amplified signal) generated by amplifying the signal output from the lower-stage transistor 12 is output from the collector of the upper-stage transistor 14. In this manner, in the power-stage amplifier, the lower-stage differential amplifying pair A1 and the upper-stage differential amplifying pair A2 are cascode-connected to each other. Details of the operation of the power-stage amplifier will be discussed later.

The bias circuits 20 through 24, each generates a bias current or a bias voltage and supply it to the bases of the transistors 10 through 14, respectively.

Figure 2A:
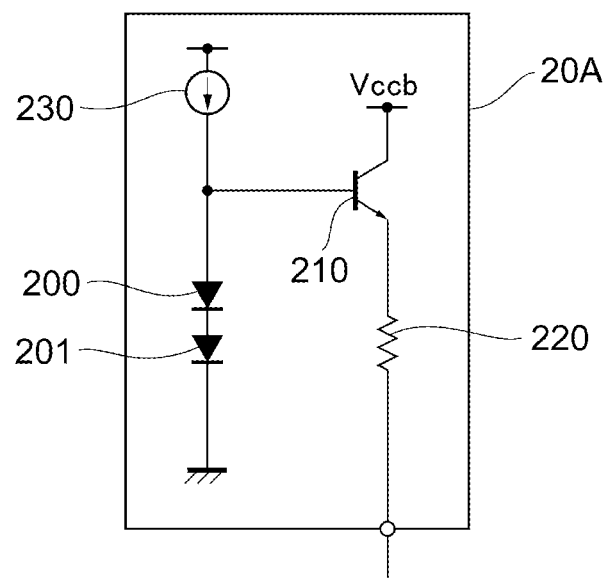
FIG. 2A illustrates an example of the configuration of a bias circuit shown in FIG. 1.

FIG. 2A illustrates an example of the configuration of the bias circuit 20 (bias circuit 20A). As shown in FIG. 2A, the bias circuit 20A includes diodes 200 and 201, a transistor 210, a resistor element 220, and a current source 230.

The diodes 200 and 201 and the current source 230 generate a predetermined level of voltage. This will be explained more specifically. The diodes 200 and 201 are connected in series with each other. A constant current is supplied from the current source 230 to the anode of the diode 200, and the cathode of the diode 201 is grounded. With this configuration, a predetermined level of voltage (about 2.6 V, for example) is generated at the anode of the diode 200. Instead of the diodes 200 and 201, transistors whose collector and base are connected to each other may be used.

A power supply voltage Vccb is supplied to the collector of the transistor 210. The base of the transistor 210 is connected to the anode of the diode 200, and the emitter is connected to one end of the resistor element 220. This enables the transistor 210 to supply a bias current from its emitter to the base of the transistor 10 (see FIG. 1) via the resistor element 220.

As a result of thermally coupling one or both of the diodes 200 and 201 to one of the transistors 10 through 14 shown in FIG. 1, the amount of a bias current can be adjusted in accordance with heat generated in the transistor coupled to the diodes 200 and 201. Thermal coupling between a diode and a transistor refers to that the amount of a bias current is changed in accordance with heat generated in this transistor. More specifically, one or both of the diodes 200 and 201 may be disposed within or close to a region where a corresponding one or plural of the transistors 10 through 14 are formed.

Figure 2B:
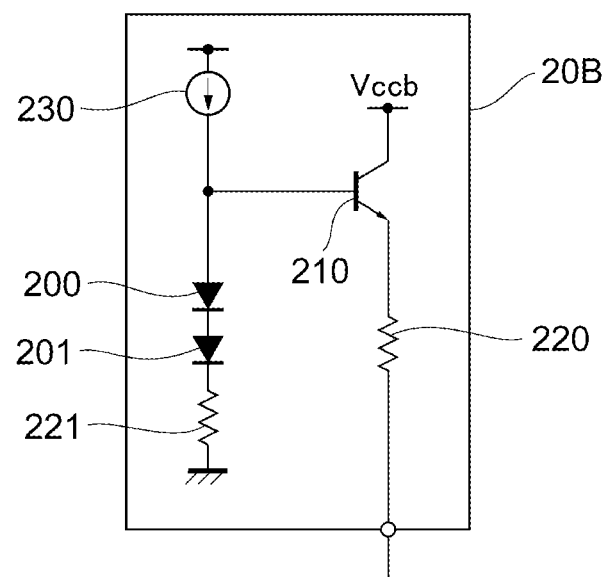
FIG. 2B illustrates another example of the configuration of the bias circuit shown in FIG. 1.

FIG. 2B illustrates another example of the configuration of the bias circuit 20 (bias circuit 20B). As shown in FIG. 2B, the bias circuit 20B includes a resistor element 221 in addition to the elements of the bias circuit 20A.

The resistor element 221 is connected between a ground and the cathode of the diode 201. This configuration allows the bias circuit 20B to adjust the voltage at the anode of the diode 200. The bias circuits 21 through 24 can be configured similarly to that of one of the bias circuits 20A and 20B, and a detailed explanation thereof will thus be omitted.

Referring back to FIG. 1, the voltage adjusting circuit 30 is disposed between the bias circuit 23 and the base of the upper-stage transistor 13, and the voltage adjusting circuit 31 is disposed between the bias circuit 24 and the base of the upper-stage transistor 14. Details of the operation of the voltage adjusting circuits 30 and 31 will be discussed later.

The combiner 50 combines the amplified signal RF3a output from the upper-stage transistor 13 and the amplified signal RF3b output from the upper-stage transistor 14 and outputs a resulting composite signal RF3.

The capacitors C1 through C3 remove direct current (DC) components of an RF signal. The inductors L1 through L5 suppress the coupling of an RF signal to a power supply circuit (not shown).

At preceding and subsequent stages of the drive-stage amplifier and the power-stage amplifier, the power amplifier circuit 100A may include matching circuits which perform impedance matching between corresponding circuits, though such matching circuits are not shown in FIG. 1.

The operation of the power-stage amplifier will be described below in detail. For the sake of description, an explanation will be given, assuming that both of the power supply voltages Vcc2 and Vcc3 are a DC voltage of about 3 V (hereinafter indicated by DC3V). However, the power supply voltages Vcc2 and Vcc3 are not limited to about 3 V. For the sake of simple explanation, it is assumed that the transistors 11 through 14 are operated in a linear region and the knee voltage can be ignored.

One end of the capacitor C4 is connected to the emitter of the upper-stage transistor 13, while the other end thereof is connected to the collector of the lower-stage transistor 11. One end of the capacitor C5 is connected to the emitter of the upper-stage transistor 14, while the other end thereof is connected to the collector of the lower-stage transistor 12. The impedance of the capacitors C4 and C5 is high in a low-frequency range and is low in a high-frequency range. The capacitor C4 thus has the function of disconnecting the upper-stage transistor 13 from the lower-stage transistor 11 in the case of a DC and connecting them in the case of an alternating current (AC). The capacitor C5 has the function of disconnecting the upper-stage transistor 14 from the lower-stage transistor 12 in the case of a DC and connecting them in the case of an AC.

One end of the inductor L6 is connected to the emitter of the upper-stage transistor 13, and the other end thereof is grounded. One end of the inductor L7 is connected to the emitter of the upper-stage transistor 14, and the other end thereof is grounded. The impedance of the inductors L6 and L7 is low in a low-frequency range and is high in a high-frequency range. The inductor L6 thus has the function of causing the emitter of the upper-stage transistor 13 to be grounded in the case of a DC and to be connected to the collector of the lower-stage transistor 11 in the case of an AC. The inductor L7 has the function of causing the emitter of the upper-stage transistor 14 to be grounded in the case of a DC and to be connected to the collector of the lower-stage transistor 12 in the case of an AC.

A description will be given by focusing on the lower-stage differential amplifying pair A1. The emitters of the transistors 11 and 12 are grounded, while the power supply voltage Vcc2 (DC3V) is supplied to the collectors of the transistors 11 and 12. The amplitude of an RF signal for the AC voltage at the collectors of the transistors 11 and 12 is about ±3 V (hereinafter indicated by AC±3V). Consequently, the collector voltages of the lower-stage transistors 11 and 12 vary in a range of about DC3V±3V (that is, about 0 to 6 V).

A description will be given by focusing on the upper-stage differential amplifying pair A2. The emitters of the upper-stage transistors 13 and 14 are grounded in the case of a DC, and the voltages at the emitters thus become DC0V. The emitters of the upper-stage transistors 13 and 14 are connected to the collectors of the lower-stage transistors 11 and 12, respectively, in the case of an AC, and the voltages at the emitters thus become AC±3V. Hence, the emitter voltages of the transistors 13 and 14 vary in a range of about DC0V±3V (that is, about −3 to 3 V). The power supply voltage Vcc3 (DC3V) is supplied to the collectors of the transistors 13 and 14 in the case of a DC, and the voltages at the collectors thus become DC3V. In the case of an AC, the voltages at the collectors of the transistors 13 and 14 become AC±6V including the range in a variation in the emitter voltage of the transistors 13 and 14. Hence, the collector voltages of the upper-stage transistors 13 and 14 vary in a range of about DC3V±6V (that is, about −3 to 9 V).

In the first embodiment, the lower-stage transistors 11 and 12 and the upper-stage transistors 13 and 14, each form a differential amplifying pair. As a result of combining the amplified signal RF3a output from the transistor 13 and the amplified signal RF3b output from the transistor 14 in the combiner 50, the composite signal RF3 output from the combiner 50 varies in a range of about −6 to 18 V. That is, the signal amplitude (about 24 V) of the composite signal RF3 is about four times as high as that (about 6 V) of the collector of each of the lower-stage transistors 11 and 12.

To turn ON the upper-stage transistors 13 and 14, the base-emitter voltages of the transistors 13 and 14 are required to be equal to or higher than a threshold voltage (about 1.3 V, for example). Accordingly, the base voltages of the transistors 13 and 14 are required to vary in a range of about DC1.3V±3V (that is, about −1.7 to 4.3 V) in accordance with the variation (AC±3V) in the emitter voltages of the transistors 13 and 14. From this point of view, in the first embodiment, the voltage adjusting circuits 30 and 31 can adjust the base voltages of the transistors 13 and 14, respectively, and the amplitude shifting of the base voltages of the transistors 13 and 14 is not restricted by the bias circuits 23 and 24. The base voltages of the transistors 13 and 14 are thus changed in accordance with the emitter voltages. As a result, the ON/OFF states of the transistors 13 and 14 become consistent with those of the transistors 11 and 12.

As described above, in the first embodiment, the amplitude of the composite signal RF3 output from the combiner 50 is about four times as high as that obtained in a configuration without necessarily using cascode connection of transistors or differential amplifying pairs. It is thus possible to increase the signal amplitude without necessarily the need for a booster conversion circuit, for example, for boosting the power supply voltage.

Assuming that output power of a signal is P, the collector voltage is V, and the load impedance of an amplifier is R, the relationships among these elements can be expressed by $P=V^2/R$. If the load impedance R is constant, when the collector voltage V is quadrupled (four times), output power P becomes 16 times higher. In the first embodiment, it is possible to increase the maximum output power without necessarily boosting the power supply voltage, that is, without necessarily substantially increasing the scale of the power amplifier circuit.

As a modified example of the first embodiment, at least one of a pair of the inductors L2 and L6 and a pair of the inductors L3 and L7 may be disposed close to each other on a substrate on which the power amplifier circuit 100A is mounted. "Disposing close to each other" refers to that two inductors are close enough to be magnetically coupled with each other. In-phase signals flow through the inductors L2 and L6 and through the inductors L3 and L7. By magnetically coupling the inductors L2 and L6 and/or the inductors L3 and L7, advantages similar to those obtained by a configuration in which the inductors L2 and L6 and/or the inductors L3 and L7 are not magnetically coupled are achieved by a smaller inductance value.

In the first embodiment, the power amplifier circuit 100A includes two stages of amplifiers. However, one stage of amplifier or three or more stages of amplifiers may be used. Although in the first embodiment the configuration using cascode connection of transistors and differential amplifying pairs is applied to the power-stage amplifier (final-stage amplifier), it may be applied to any stage of the amplifier or all stages of amplifiers in the power amplifier circuit.

In the first embodiment, two stages of transistors are cascode-connected. However, three or more stages of transistors may be cascode-connected. In this case, the signal amplitude at the collector of the transistor of the highest stage is further increased. For example, if N (N is an integer or two or greater) transistors are cascode-connected, the signal amplitude at the collector of the transistor of the N-th stage becomes higher than that of a single transistor by a factor of about N.

FIG. 3 illustrates an example of the configuration of a power amplifier circuit 100B according to a second embodiment of the disclosure. In the second through fifth embodiments, the same elements as those of the first embodiment are designated by like reference numerals, and an explanation thereof will be omitted. The second through fifth embodiments will be described mainly by referring to points different from the first embodiment while omitting the same points as those of the first embodiment. An explanation of similar advantages obtained by similar configurations will not be repeated.

In FIG. 3, an example of the specific configuration of the voltage adjusting circuits 30 and 31 is shown. The power amplifier circuit 100B is different from the power amplifier circuit 100A in that the drive-stage amplifier also performs a differential amplifying operation. More specifically, the power amplifier circuit 100B also includes a transistor 15, a bias circuit 25, a capacitor C8, and an inductor L10. The power amplifier circuit 100B includes a divider 41 instead of the divider 40.

The voltage adjusting circuit 30 includes a capacitor C6 and an inductor L8. One end of the capacitor C6 (third capacitor) is connected to the base of the upper-stage transistor 13, and the other end thereof is grounded. A bias current from the bias circuit 23 is supplied to one end of the inductor L8, and the other end of the inductor L8 is connected to the base of the upper-stage transistor 13. The voltage adjusting circuit 31 includes a capacitor C7 and an inductor L9. One end of the capacitor C7 (fourth capacitor) is connected to the base of the upper-stage transistor 14, and the other end thereof is grounded. A bias current from the bias circuit 24 is supplied to one end of the inductor L9, and the other end of the inductor L9 is connected to the base of the upper-stage transistor 14.

By the provision of the capacitors C6 and C7 in the voltage adjusting circuits 30 and 31, the base voltages of the transistors 13 and 14 can be adjusted. The amplitude shifting of the base voltages of the transistors 13 and 14 is not restricted by the bias circuits 23 and 24. The capacitance of the capacitors C6 and C7 can be smaller than that of the capacitors C4 and C5. The reason for this is that an excessively large capacitance of the capacitors C6 and C7 limits shifting of the base voltage of the transistors 13 and 14.

The divider 41, which is disposed at a preceding stage of the drive-stage amplifier, divides an input signal RF1 into an input signal RF1a (third signal) and an input signal RF1b (fourth signal) having opposite phases and outputs the input signals RF1a and RF1b.

The transistor 15 (sixth transistor) forms a differential amplifying pair A3 with the transistor 10 (fifth transistor). The transistor 15 will be explained more specifically. A power supply voltage Vcc1 (third power supply voltage) is supplied to the collector of the transistor 15 via the inductor L10. The amplified signal RF1b is supplied to the base of the transistor 15 via the capacitor C8. The emitter of the transistor 15 is grounded. A bias current or a bias voltage from the bias circuit 25 is supplied to the base of the transistor 15. With this configuration, an amplified signal RF2b is output from the collector of the transistor 15. The amplified signals RF2a and RF2b output from the collectors of the transistors 10 and 15 are respectively supplied to the transistors 11 and 12 forming the lower-stage differential amplifying pair A1 of the power-stage amplifier.

The configurations of the bias circuit 25, the capacitor C8, and the inductor L10 are similar to those of the bias circuit 20, the capacitor C1, and the inductor L1, and a detailed explanation thereof will thus be omitted.

With this configuration, too, the power amplifier circuit 100B achieves advantages similar to those obtained by the power amplifier circuit 100A. The power amplifier circuit 100B includes the differential amplifying pair A3 in the drive-stage amplifier and can thus increase the amplification factor to be even higher than the power amplifier circuit 100A.

In the second embodiment, the drive-stage amplifier includes the differential amplifying pair A3 and the transistors 10 and 15 are not cascode-connected to another transistor. However, as in the power-stage amplifier, the transistors 10 and 15 may be cascode-connected to another transistor in the drive-stage amplifier. Alternatively, the configuration using cascode connection of transistors is applied to the drive-stage amplifier without necessarily forming a differential amplifying pair.

The configurations of the voltage adjusting circuits 30 and 31 shown in FIG. 3 are only an example. The voltage adjusting circuit 30 may include an inductor connected in series with the capacitor C6 between the base of the transistor 13 and a ground. Likewise, the voltage adjusting circuit 31 may include an inductor connected in series with the capacitor C7 between the base of the transistor 14 and a ground.

Figure 4:
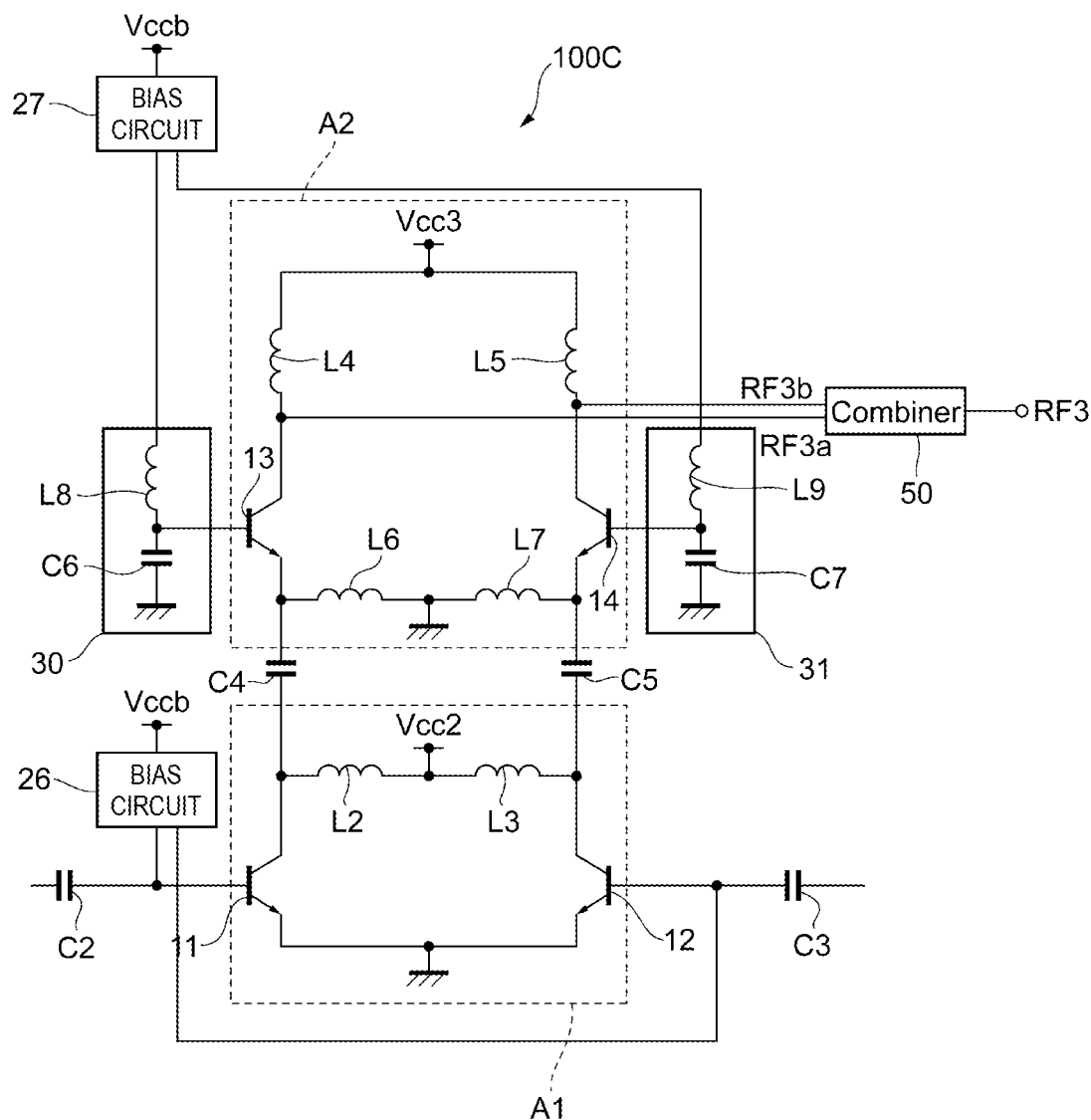
FIG. 4 illustrates an example of the configuration of a power amplifier circuit according to a third embodiment of the disclosure.
Figure 6:
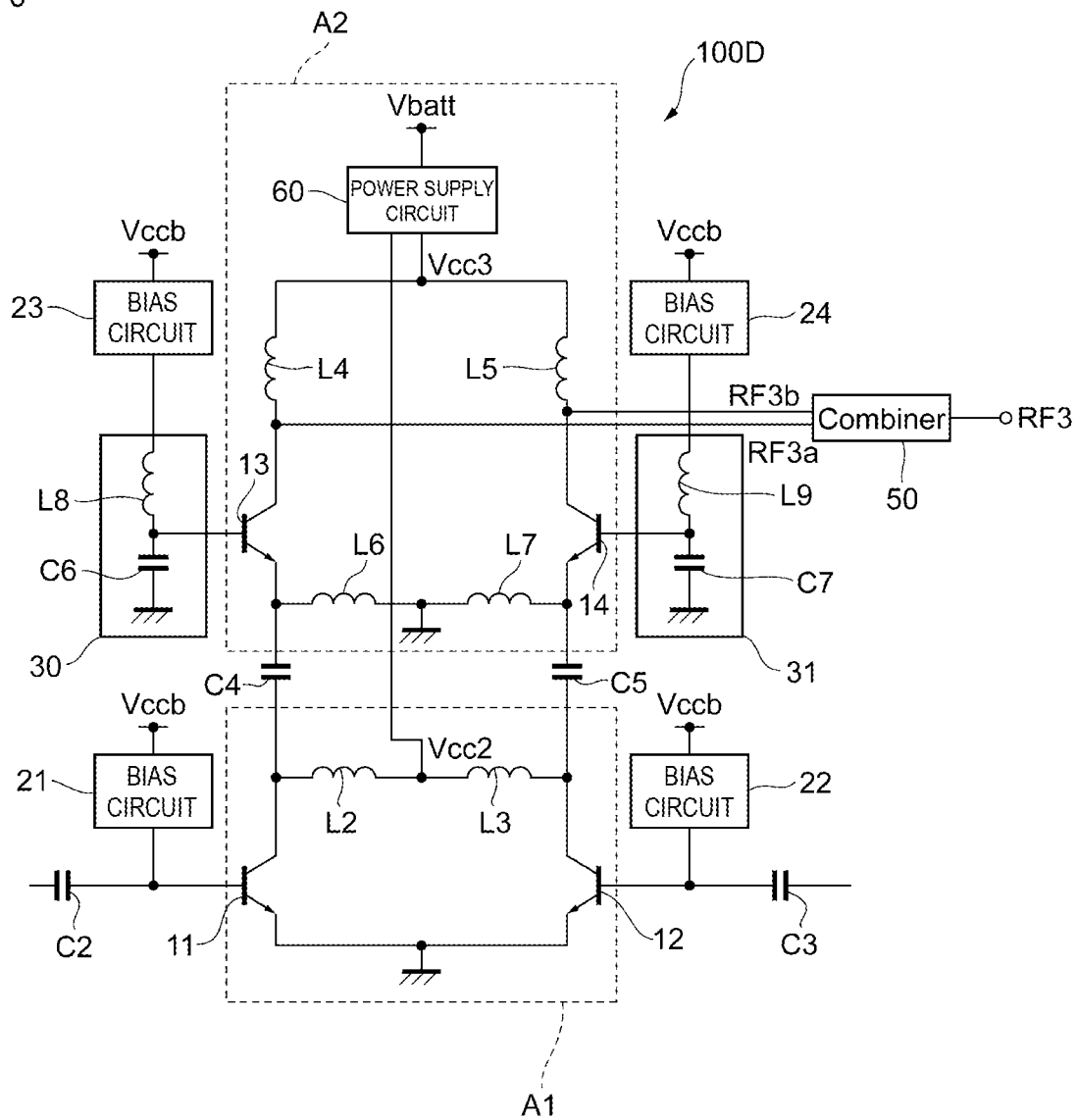
FIG. 6 illustrates an example of the configuration of a power amplifier circuit according to a fourth embodiment of the disclosure.
Figure 7:
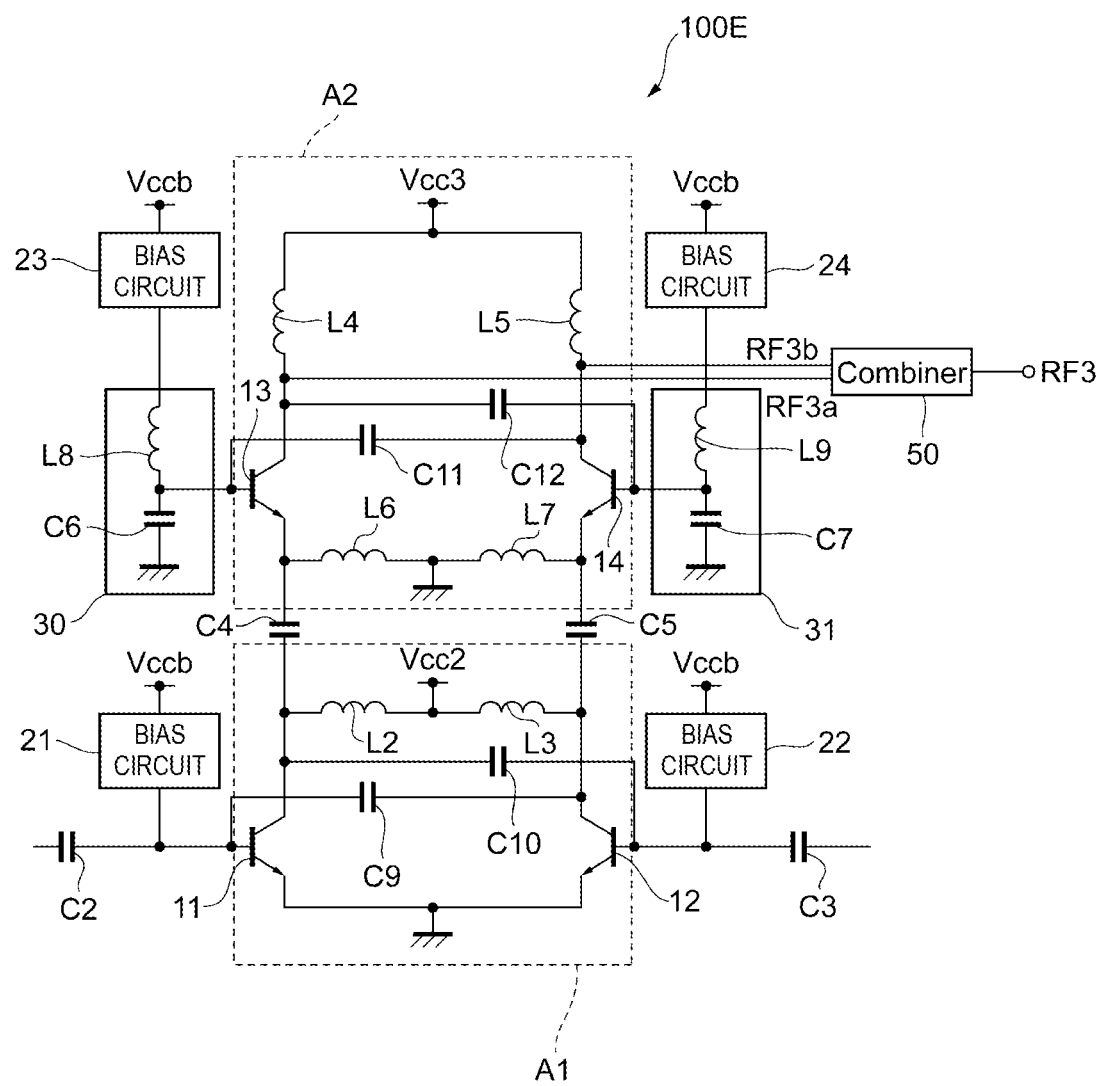
FIG. 7 illustrates an example of the configuration of a power amplifier circuit according to a fifth embodiment of the disclosure.

FIG. 4 illustrates an example of the configuration of a power amplifier circuit 100C according to a third embodiment of the disclosure. For the sake of description, elements only related to the power-stage amplifier are shown in FIGS. 4, 6, and 7, while elements related to the drive-stage amplifier are omitted. As shown in FIG. 4, the power amplifier circuit 100C includes bias circuits 26 and 27 instead of the bias circuits 21 through 24 provided in the power amplifier circuit 100A.

The bias circuit 26 (first bias circuit) supplies a bias current to both of the transistors 11 and 12 forming the lower-stage differential amplifying pair A1. The bias circuit 27 (second bias circuit) supplies a bias current to both of the transistors 13 and 14 forming the upper-stage differential amplifying pair A2. That is, in the third embodiment, the same bias circuit is used for two transistors forming a differential amplifying pair.

Figure 5A:
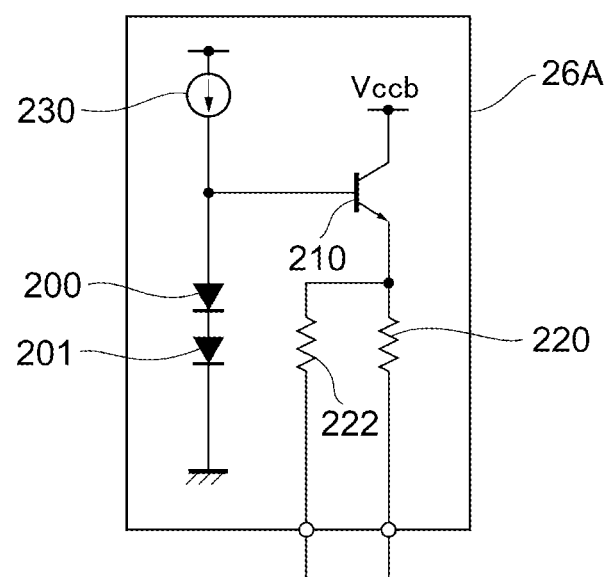
FIG. 5A illustrates an example of the configuration of a bias circuit shown in FIG. 4.
Figure 5B:
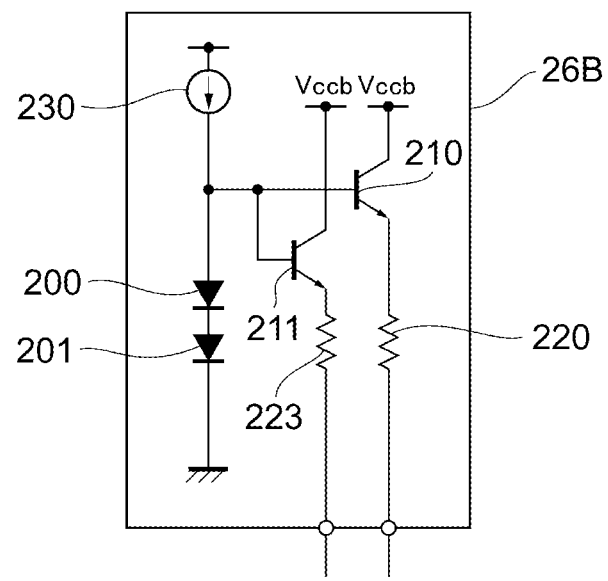
FIG. 5B illustrates another example of the configuration of the bias circuit shown in FIG. 4.

FIG. 5A illustrates an example of the configuration of the bias circuit 26 (bias circuit 26A). FIG. 5B illustrates another example of the configuration of the bias circuit 26 (bias circuit 26B). The bias circuit 27 may be configured similarly to the bias circuit 26, and a detailed explanation thereof will thus be omitted.

The bias circuit 26A shown in FIG. 5A is different from the bias circuit 20A shown in FIG. 2A in that it also includes a resistor element 222. One end of the resistor element 222 is connected to the emitter of the transistor 210 and the other end thereof is connected to the base of the transistor 12 (see FIG. 4). This configuration enables the bias circuit 26A to supply a bias current from the emitter of the transistor 210 to the bases of the transistors 11 and 12 (see FIG. 4) via the resistor elements 220 and 222.

The bias circuit 26B shown in FIG. 5B is different from the bias circuit 20A in FIG. 2A in that it also includes a transistor 211 and a resistor element 223. A power supply voltage Vccb is supplied to the collector of the transistor 211. The base of the transistor 211 is connected to the anode of the diode 200, and the emitter thereof is connected to one end of the resistor element 223. One end of the resistor element 223 is connected to the emitter of the transistor 211, and the other end thereof is connected to the base of the transistor 12 (see FIG. 4). This configuration enables the bias circuit 26B to supply a bias current from the emitters of the transistors 210 and 211 to the bases of the transistors 11 and 12 (see FIG. 4) via the resistor elements 220 and 223.

With this configuration, too, the power amplifier circuit 100C achieves advantages similar to those obtained by the power amplifier circuit 100A. The area of the power amplifier circuit 100C is reduced to be smaller than that of the configuration in which a bias circuit is provided for each transistor. Using the same bias circuit for transistors forming a differential amplifying pair can eliminate variations in the elements included in bias circuits provided for individual transistors. This enhances the performance of the differential amplifying operation.

In the third embodiment, a shared bias circuit is used for the lower-stage differential amplifying pair A1 and another shared bias circuit is used for the upper-stage differential amplifying pair A2. However, a shared bias circuit may be used for only one of the differential amplifying pairs A1 and A2.

The bias circuits 26A and 26B may include an element corresponding to the resistor element 221 between the cathode of the diode 201 and a ground, as in the bias circuit 20B shown in FIG. 2B.

FIG. 6 illustrates an example of the configuration of a power amplifier circuit 100D according to a fourth embodiment of the disclosure. The power amplifier circuit 100D is different from the power amplifier circuit 100A in that it also includes a power supply circuit 60.

The power supply circuit 60 generates power supply voltages Vcc2 and Vcc3 from a battery voltage Vbatt in accordance with the operating mode of the power amplifier circuit 100D. In the fourth embodiment, it is assumed that the power supply voltages Vcc2 and Vcc3 have the same voltage value.

When the power amplifier circuit 100D is operated in the average power tracking (APT) mode, the power supply circuit 60 generates a voltage which varies in accordance with the average output power of the power amplifier circuit 100D and outputs the generated voltage as the power supply voltages Vcc2 and Vcc3. When the power amplifier circuit 100D is operated in the envelope tracking (ET) mode, the power supply circuit 60 generates a voltage which varies in accordance with the envelope of an input signal and outputs the generated voltage as the power supply voltages Vcc2 and Vcc3. In the ET mode, the power supply voltages Vcc2 and Vcc3 are controlled in accordance with the amplitude level of an input signal, thereby enhancing the power efficiency to be higher than in the APT mode. The power supply circuit 60 may be able to generate a voltage as a result of being switched between the APT mode and the ET mode in response to a control signal. Alternatively, the power supply circuit 60 may generate a power supply voltage in accordance with only one of the APT mode and the ET mode.

With this configuration, too, the power amplifier circuit 100D achieves advantages similar to those obtained by the power amplifier circuit 100A.

Although the power supply circuit 60 is included within the power amplifier circuit 100D in the fourth embodiment, it may be disposed outside the power amplifier circuit 100D.

FIG. 7 illustrates an example of the configuration of a power amplifier circuit 100E according to a fifth embodiment of the disclosure. As shown in FIG. 7, the power amplifier circuit 100E includes four capacitors C9 through C12 in addition to the elements of the power amplifier circuit 100A.

The capacitor C9 (fifth capacitor) is connected between the base of the transistor 11 and the collector of the transistor 12. The capacitor C10 (sixth capacitor) is connected between the base of the transistor 12 and the collector of the transistor 11. The capacitor C11 (seventh capacitor) is connected between the base of the transistor 13 and the collector of the transistor 14. The capacitor C12 (eighth capacitor) is connected between the base of the transistor 14 and the collector of the transistor 13. The capacitance of the capacitors C9 through C12 can be smaller than that of the capacitors C4 and C5.

In the fifth embodiment, the connection mode in which the capacitor C9 is connected to the lower-stage transistors 11 and 12 and that of the capacitor C10 connected to the lower-stage transistors 11 and 12 are opposite, and the connection mode in which the capacitor C11 is connected to the upper-stage transistors 13 and 14 and that of the capacitor C12 connected to the upper-stage transistors 13 and 14 are opposite. This configuration can cancel out the influences of the Miller capacitances in the transistors 11 through 14. The power amplifier circuit 100E can obtain a higher gain even in a high-frequency band which is vulnerable to the influence of the Miller capacitance.

Figure 8A:
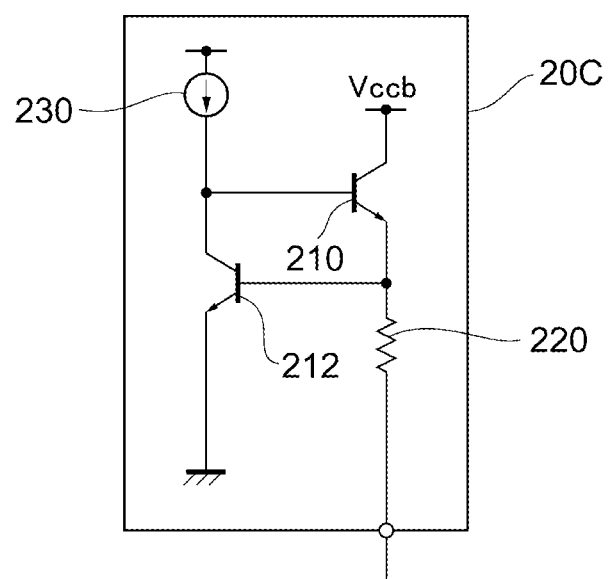
FIG. 8A illustrates another example of the configuration of the bias circuit shown in FIG. 1.

FIG. 8A illustrates another example of the configuration of the bias circuit 20 (bias circuit 20C). The bias circuit 20C shown in FIG. 8A is different from the bias circuit 20A in FIG. 2A in that it includes a transistor 212 instead of the diodes 200 and 201.

A constant current is supplied from the current source 230 to the collector of the transistor 212. The base of the transistor 212 is connected to a node between the emitter of the transistor 210 and the resistor element 220, and the emitter thereof is grounded. A current output from the emitter of the transistor 210 is divided and supplied to the transistor 10 (see FIG. 1) and the transistor 212. When the amount of a bias current supplied to the base of the transistor 10 is increased, a current flowing between the collector and the emitter of the transistor 212 also increases in theory. However, the current flowing between the collector and the emitter of the transistor 212 is restricted by the current source 230. This regulates a rise in the collector voltage of the transistor 212 (that is, the base voltage of the transistor 210), and as a result, the current output from the emitter of the transistor 210 is decreased.

In this manner, negative feedback is applied to the bias circuit 20C in accordance with variations in the amount of a bias current output from the bias circuit 20C, thereby making it possible to supply a stable bias current. The configuration of the bias circuit 20C is applicable to all the bias circuits 20 through 25.

In a manner similar to the diodes 200 and 201, as a result of thermally coupling the transistor 212 to one of the transistors 10 through 14 shown in FIG. 1, the amount of a bias current can be adjusted in accordance with heat generated in the transistor coupled to the transistor 212. To thermally couple the transistor 212 to one of the transistors 10 through 14, the transistor 212 is disposed within or close to a region where a corresponding one of the transistors 10 through 14 is formed.

Figure 8B:
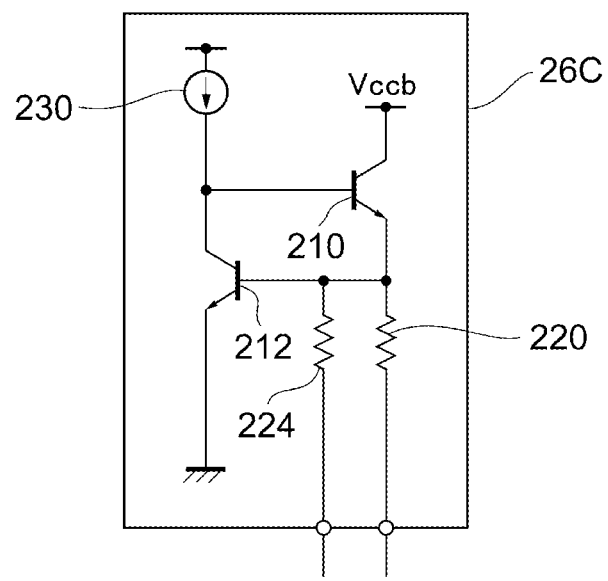
FIG. 8B illustrates another example of the configuration of the bias circuit shown in FIG. 4.

FIG. 8B illustrates another example of the configuration of the bias circuit 26 (bias circuit 26C). The bias circuit 26C shown in FIG. 8B is different from the bias circuit 20C in FIG. 8A in that it also includes a resistor element 224.

One end of the resistor element 224 is connected to the emitter of the transistor 210, and the other end thereof is connected to the base of the transistor 12 (see FIG. 4). This configuration enables the bias circuit 26C to supply a bias current from the emitter of the transistor 210 to the bases of the transistors 11 and 12 (see FIG. 4) via the resistor elements 220 and 224.

As in the bias circuit 20C, negative feedback is applied to the bias circuit 26C in accordance with variations in the amount of a bias current output from the bias circuit 26C, thereby making it possible to supply a stable bias current. The configuration of the bias circuit 26C is applicable to both of the bias circuits 26 and 27.

In the bias circuits 20C and 26C, both of the transistors 210 and 212 are constituted by HBTs by way of example. Alternatively, one or both of the transistors 210 and 212 may be constituted by FETs.

Embodiments of the disclosure have been discussed above. The power amplifier circuits 100A through 100E, each includes a lower-stage differential amplifying pair A1, an upper-stage differential amplifying pair A2, a combiner 50, inductors L6 and L7, and capacitors C4 and C5. Amplified signals RF2a and RF2b are input into the lower-stage differential amplifying pair A1. The upper-stage differential amplifying pair A2 is disposed at an upper stage of the lower-stage differential amplifying pair A1, and outputs amplified signals RF3a and RF3b corresponding to the amplified signals RF2a and RF2b, respectively. The combiner 50 combines the amplified signals RF3a and RF3b and outputs a composite signal RF3. The lower-stage differential amplifying pair A1 includes transistors 11 and 12. A power supply voltage Vcc2 is supplied to the collector of the transistor 11. The emitter of the transistor 11 is grounded and the amplified signal RF2a is supplied to the base of the transistor 11. The power supply voltage Vcc2 is supplied to the collector of the transistor 12. The emitter of the transistor 12 is grounded and the amplified signal RF2b is supplied to the base of the transistor 12. The upper-stage differential amplifying pair A2 includes transistors 13 and 14. A power supply voltage Vcc3 is supplied to the collector of the transistor 13. The emitter of the transistor 13 is grounded via the inductor L6 and is also connected to the collector of the transistor 11 via the capacitor C4. The power supply voltage Vcc3 is supplied to the collector of the transistor 14. The emitter of the transistor 14 is grounded via the inductor L7 and is also connected to the collector of the transistor 12 via the capacitor C5. With this configuration, the amplitude of the composite signal RF3 output from the combiner 50 becomes about four times as high as that obtained in a configuration without necessarily using cascode connection of transistors or differential amplifying pairs. It is thus possible to increase the maximum output power without necessarily boosting the power supply voltage, that is, without necessarily substantially increasing the scale of the power amplifier circuits.

The power amplifier circuits 100A through 100E may each further include capacitors C6 and C7. One end of the capacitor C6 is connected to the base of the transistor 13 and the other end thereof is grounded. One end of the capacitor C7 is connected to the base of the transistor 14 and the other end thereof is grounded. The capacitance of the capacitors C6 and C7 may be smaller than that of the capacitors C4 and C5. With this configuration, the amplitude shifting of the base voltages of the transistors 13 and 14 is not restricted by the bias circuits 23 and 24. As a result, the ON/OFF states of the transistors 13 and 14 become consistent with those of the transistors 11 and 12.

The power amplifier circuit 100E may also include capacitors C9 through C12. The capacitor C9 is connected between the collector or the drain of one of the transistors 11 and 12 and the base or the gate of the other one of the transistors 11 and 12. The capacitor C10 is connected between the collector or the drain of one of the transistors 11 and 12 and the base or the gate of the other one of the transistors 11 and 12. The capacitor C11 is connected between the collector or the drain of one of the transistors 13 and 14 and the base or the gate of the other one of the transistors 13 and 14. The capacitor C12 is connected between the collector or the drain of one of the transistors 13 and 14 and the base or the gate of the other one of the transistors 13 and 14. The capacitance of the capacitors C9 through C12 may be smaller than that of the capacitors C4 and C5. This configuration can cancel out the influences of the Miller capacitances in the transistors 11 through 14. The power amplifier circuit 100E can thus obtain a higher gain than the power amplifier circuit 100A.

In the power amplifier circuit 100D, the voltage corresponding to the average output power may be used as the power supply voltages Vcc2 and Vcc3 (APT mode). Alternatively, the voltage which varies in accordance with the amplitude level of an input signal may be used as the power supply voltages Vcc2 and Vcc3 (ET mode). Using the ET mode makes it possible to enhance the power efficiency to be higher than in the APT mode.

The power amplifier circuits 100A through 100E may each further include inductors L2 and L3. The inductors L2 and L3 are respectively connected to the collectors of the transistors 11 and 12 and allow the power supply voltage Vcc2 to pass through the inductors L2 and L3. The inductors L6 and L2 may be electromagnetically coupled with each other, and the inductors L7 and L3 may be electromagnetically coupled with each other. With this configuration, advantages similar to those obtained by a configuration without necessarily having magnetic coupling between inductors are achieved with a smaller inductance value.

The power amplifier circuit 100C may each further include bias circuits 26 and 27. The bias circuit 26 supplies a bias current or a bias voltage to the transistors 11 and 12. The bias circuit 27 supplies a bias current or a bias voltage to the transistors 13 and 14. The area of the power amplifier circuit 100C is reduced to be smaller than the configuration in which a bias circuit is provided for each transistor. Using the same bias circuit for transistors forming a differential amplifying pair can eliminate variations in the elements included in bias circuits provided for individual transistors. This enhances the performance of the differential amplifying operation.

The power amplifier circuit 100B may each further include a divider 41 and a differential amplifying pair A3. The divider 41 divides an input signal into input signals RF1a and RF1b. The input signals RF1a and RF1b are input into the differential amplifying pair A3. The differential amplifying pair A3 includes transistors 10 and 15. A power supply voltage Vcc1 is supplied to the collector of the transistor 10. The emitter of the transistor 10 is grounded, and the input signal RF1a is supplied to the base of the transistor 10. The amplified signal RF2a is output from the collector of the transistor 10. The power supply voltage Vcc1 is supplied to the collector of the transistor 15. The emitter of the transistor 15 is grounded, and the input signal RF1b is supplied to the base of the transistor 15. The amplified signal RF2b is output from the collector of the transistor 15. The power amplifier circuit 100B includes the differential amplifying pair A3 in the drive-stage amplifier and can thus increase the amplification factor to be even higher than the power amplifier circuit 100A.

The above-described embodiments are provided for facilitating the understanding of the disclosure but are not intended to be exhaustive or to limit the disclosure to the precise forms disclosed. Modifications and/or improvements may be made without necessarily departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the disclosure within the scope and spirit of the disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
    a lower-stage differential amplifying pair into which first and second signals are inputted;
    an upper-stage differential amplifying pair that is disposed at an upper stage of the lower-stage differential amplifying pair and that outputs first and second amplified signals corresponding to the first and second signals, respectively;
    a combiner that combines the first and second amplified signals and outputs a composite signal;
    first and second inductors; and
    first and second capacitors, wherein:
    the lower-stage differential amplifying pair includes:
        a first transistor, a first power supply voltage being supplied to a collector or a drain of the first transistor, the first signal being supplied to a base or a gate of the first transistor, and
        a second transistor, the first power supply voltage being supplied to a collector or a drain of the second transistor, the second signal being supplied to a base or a gate of the second transistor, and
    the upper-stage differential amplifying pair includes:
        a third transistor, an emitter or a source of the third transistor being grounded via the first inductor and also being connected to the collector or the drain of the first transistor via the first capacitor, and
        a fourth transistor, an emitter or a source of the fourth transistor being grounded via the second inductor and also being connected to the collector or the drain of the second transistor via the second capacitor.

2. The power amplifier circuit according to claim 1, further comprising:
    a third capacitor, one end of the third capacitor being connected to the base or the gate of the third transistor, the other end of the third capacitor being grounded; and
    a fourth capacitor, one end of the fourth capacitor being connected to the base or the gate of the fourth transistor, the other end of the fourth capacitor being grounded,
    wherein a capacitance value of the third and fourth capacitors is smaller than the capacitance value of the first and second capacitors.

3. The power amplifier circuit according to claim 1, further comprising:
    fifth and sixth capacitors, the fifth capacitor being connected between the collector or the drain of one of the first and second transistors and the base or the gate of the other one of the first and second transistors, the sixth capacitor being connected between the collector or the drain of the other one of the first and second transistors and the base or the gate of the one of the first and second transistors, the collector or the drain of the first transistor and the second transistor being connected to one of the fifth and sixth capacitors, the base or the gate of the first transistor and the second transistor being connected to the other one of the fifth and sixth capacitors; and
    seventh and eighth capacitors, the seventh capacitor being connected between a collector or a drain of one of the third and fourth transistors and the base or the gate of the other one of the third and fourth transistors, the eighth capacitor being connected between the collector or the drain of one of the third and fourth transistors and the base or the gate of the other one of the third and fourth transistors, the collector or the drain of the third transistor and the fourth transistor being connected to one of the seventh and eighth capacitors, the base or the gate of the third transistor and the fourth transistor being connected to the other one of the seventh and eighth capacitors,
    wherein a capacitance value of the fifth through eighth capacitors is smaller than a capacitance value of the first and second capacitors.

4. The power amplifier circuit according to claim 2, further comprising:
    fifth and sixth capacitors, the fifth capacitor being connected between a collector or the drain of one of the first and second transistors and the base or the gate of the other one of the first and second transistors, the sixth capacitor being connected between the collector or the drain of the other one of the first and second transistors and the base or the gate of the one of the first and second transistors, the collector or the drain of the first transistor and the second transistor being connected to one of the fifth and sixth capacitors, the base or the gate of the first transistor and the second transistor being connected to the other one of the fifth and sixth capacitors; and seventh and eighth capacitors, the seventh capacitor being connected between the collector or a drain of one of the third and fourth transistors and the base or the gate of the other one of the third and fourth transistors, the eighth capacitor being connected between the collector or the drain of one of the third and fourth transistors and the base or the gate of the other one of the third and fourth transistors, the collector or the drain of the third transistor and the fourth transistor being connected to one of the seventh and eighth capacitors, the base or the gate of the third transistor and the fourth transistor being connected to the other one of the seventh and eighth capacitors, wherein a capacitance value of the fifth through eighth capacitors is smaller than a capacitance value of the first and second capacitors.

5. The power amplifier circuit according to claim 1, wherein the first power supply voltage is a voltage corresponding to an average output power of the power amplifier circuit.

6. The power amplifier circuit according to claim 2, wherein the first power supply voltage is a voltage corresponding to an average output power of the power amplifier circuit.

7. The power amplifier circuit according to claim 3, wherein the first power supply voltage is a voltage corresponding to an average output power of the power amplifier circuit.

8. The power amplifier circuit according to claim 1, wherein the first power supply voltage is a voltage which varies in accordance with an amplitude level of a signal inputted into the power amplifier circuit.

9. The power amplifier circuit according to claim 2, wherein the first power supply voltage is a voltage which varies in accordance with an amplitude level of a signal inputted into the power amplifier circuit.

10. The power amplifier circuit according to claim 3, wherein the first power supply voltage is a voltage which varies in accordance with an amplitude level of a signal inputted into the power amplifier circuit.

11. The power amplifier circuit according to claim 1, further comprising:
a third inductor that is connected to the collector or the drain of the first transistor and allows the first power supply voltage to pass through the third inductor; and
a fourth inductor that is connected to the collector or the drain of the second transistor and allows the first power supply voltage to pass through the fourth inductor,
wherein the first and third inductors are electromagnetically coupled with each other and the second and fourth inductors are electromagnetically coupled with each other.

12. The power amplifier circuit according to claim 2, further comprising:
a third inductor that is connected to the collector or the drain of the first transistor and allows the first power supply voltage to pass through the third inductor; and
a fourth inductor that is connected to the collector or the drain of the second transistor and allows the first power supply voltage to pass through the fourth inductor,
wherein the first and third inductors are electromagnetically coupled with each other and the second and fourth inductors are electromagnetically coupled with each other.

13. The power amplifier circuit according to claim 3, further comprising:
a third inductor that is connected to the collector or the drain of the first transistor and allows the first power supply voltage to pass through the third inductor; and
a fourth inductor that is connected to the collector or the drain of the second transistor and allows the first power supply voltage to pass through the fourth inductor,
wherein the first and third inductors are electromagnetically coupled with each other and the second and fourth inductors are electromagnetically coupled with each other.

14. The power amplifier circuit according to claim 1, further comprising:
a first bias circuit that supplies a bias current or a bias voltage to the first and second transistors; and
a second bias circuit that supplies a bias current or a bias voltage to the third and fourth transistors.

15. The power amplifier circuit according to claim 2, further comprising:
a first bias circuit that supplies a bias current or a bias voltage to the first and second transistors; and
a second bias circuit that supplies a bias current or a bias voltage to the third and fourth transistors.

16. The power amplifier circuit according to claim 3, further comprising:
a first bias circuit that supplies a bias current or a bias voltage to the first and second transistors; and
a second bias circuit that supplies a bias current or a bias voltage to the third and fourth transistors.

17. The power amplifier circuit according to claim 1, further comprising:
a divider that divides an input signal into third and fourth signals; and
a differential amplifying pair into which the third and fourth signals are input,
the differential amplifying pair including
a fifth transistor, a third power supply voltage being supplied to a collector or a drain of the fifth transistor, an emitter or a source of the fifth transistor being grounded, the third signal being supplied to a base or a gate of the fifth transistor, the first signal being outputted from the collector or the drain of the fifth transistor, and
a sixth transistor, the third power supply voltage being supplied to a collector or a drain of the sixth transistor, an emitter or a source of the sixth transistor being grounded, the fourth signal being supplied to a base or a gate of the sixth transistor, the second signal being outputted from the collector or the drain of the sixth transistor.

18. The power amplifier circuit according to claim 2, further comprising:
a divider that divides an input signal into third and fourth signals; and
a differential amplifying pair into which the third and fourth signals are input,
the differential amplifying pair including
a fifth transistor, a third power supply voltage being supplied to a collector or a drain of the fifth transistor, an emitter or a source of the fifth transistor being grounded, the third signal being supplied to a base or a gate of the fifth transistor, the first signal being outputted from the collector or the drain of the fifth transistor, and
a sixth transistor, the third power supply voltage being supplied to a collector or a drain of the sixth transistor, an emitter or a source of the sixth transistor being grounded, the fourth signal being supplied to a base or a gate of the sixth transistor, the second signal being outputted from the collector or the drain of the sixth transistor.

19. The power amplifier circuit according to claim 3, further comprising:
- a divider that divides an input signal into third and fourth signals; and
- a differential amplifying pair into which the third and fourth signals are input,
- the differential amplifying pair including
  - a fifth transistor, a third power supply voltage being supplied to a collector or a drain of the fifth transistor, an emitter or a source of the fifth transistor being grounded, the third signal being supplied to a base or a gate of the fifth transistor, the first signal being outputted from the collector or the drain of the fifth transistor, and
  - a sixth transistor, the third power supply voltage being supplied to a collector or a drain of the sixth transistor, an emitter or a source of the sixth transistor being grounded, the fourth signal being supplied to a base or a gate of the sixth transistor, the second signal being outputted from the collector or the drain of the sixth transistor.

20. The power amplifier circuit according to claim 5, further comprising:
- a divider that divides an input signal into third and fourth signals; and
- a differential amplifying pair into which the third and fourth signals are input,
- the differential amplifying pair including
  - a fifth transistor, a third power supply voltage being supplied to a collector or a drain of the fifth transistor, an emitter or a source of the fifth transistor being grounded, the third signal being supplied to a base or a gate of the fifth transistor, the first signal being outputted from the collector or the drain of the fifth transistor, and
  - a sixth transistor, the third power supply voltage being supplied to a collector or a drain of the sixth transistor, an emitter or a source of the sixth transistor being grounded, the fourth signal being supplied to a base or a gate of the sixth transistor, the second signal being outputted from the collector or the drain of the sixth transistor.

* * * * *